United States Patent
Yoon

(10) Patent No.: US 7,721,147 B2
(45) Date of Patent: May 18, 2010

(54) METHOD AND APPARATUS FOR MANAGING BAD RUN-TIME BLOCK IN MLC FLASH MEMORY

(75) Inventor: Song-ho Yoon, Yongin-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 390 days.

(21) Appl. No.: 11/742,604

(22) Filed: May 1, 2007

(65) Prior Publication Data
US 2008/0059835 A1 Mar. 6, 2008

(30) Foreign Application Priority Data
Sep. 4, 2006 (KR) .................. 10-2006-0084877

(51) Int. Cl.
G06F 11/00 (2006.01)
(52) U.S. Cl. .............................. 714/8; 714/5
(58) Field of Classification Search ............. 714/8, 714/5–7, 42, 54
See application file for complete search history.

(56) References Cited

U.S. PATENT DOCUMENTS

| 5,297,148 | A | * | 3/1994 | Harari et al. ............... 714/710 |
| 5,473,753 | A | * | 12/1995 | Wells et al. ............... 714/5 |
| 5,535,328 | A | * | 7/1996 | Harari et al. ............... 714/7 |
| 6,260,156 | B1 | * | 7/2001 | Garvin et al. ............... 714/8 |
| 2006/0126387 | A1 | * | 6/2006 | Kim et al. ............... 365/185.17 |
| 2008/0005471 | A1 | * | 1/2008 | Ma et al. ............... 711/115 |
| 2008/0082736 | A1 | * | 4/2008 | Chow et al. ............... 711/103 |
| 2008/0313389 | A1 | * | 12/2008 | Chow et al. ............... 711/103 |
| 2009/0044061 | A1 | * | 2/2009 | Visconti ............... 714/718 |

FOREIGN PATENT DOCUMENTS

| KR | 1999-0055972 A | 7/1999 |
| KR | 10-2002-0032340 A | 5/2002 |
| KR | 10-2004-0086923 A | 10/2004 |
| KR | 2005-196658 A | 7/2005 |

* cited by examiner

Primary Examiner—Dieu-Minh Le
(74) Attorney, Agent, or Firm—Sughrue Mion, PLLC

(57) ABSTRACT

A method and apparatus are provided for managing a bad run-time block in a multi-level cell flash memory. The apparatus includes a buffer-allotting module which allots a buffer in which data programmed in a least significant bit (LSB) of a cell is temporarily stored, a data-copying module which copies the data programmed in the LSB of the cell to the allotted buffer, and a bad-block-managing module which programs the copied data to a free block if a program error occurs in a page of the cell.

16 Claims, 6 Drawing Sheets

MSB PAGE PROGRAM: "0 0" STATUS PROGRAM

MSB PAGE PROGRAM: ERROR OCCURS DURING "1 0" STATUS PROGRAM

MSB PAGE PROGRAM: "0 1" STATUS PROGRAM

MSB PAGE PROGRAM: ERROR OCCURS DURING "0 1" STATUS PROGRAM

METHOD AND APPARATUS FOR MANAGING BAD RUN-TIME BLOCK IN MLC FLASH MEMORY

CROSS-REFERENCE TO RELATED APPLICATION

This application claims priority from Korean Patent Application No. 10-2006-0084877 filed on Sep. 4, 2006, in the Korean Intellectual Property Office, the disclosure of which is incorporated herein in its entirety by reference.

BACKGROUND OF THE INVENTION

1. Field of the Invention

Apparatuses and methods consistent with the present invention relate to managing a bad run-time block in a multi-level cell (MLC) flash memory, and more particularly, to managing a bad run-time block in an MLC flash memory.

2. Description of the Related Art

Flash memories are widely used in mobile digital devices such as mobile phones, personal data assistants (PDAs), MP3 players, navigation devices, and digital cameras, and as a result there is an increasing demand for low-cost flash memories.

Current flash memories are a single level cell (SLC) NAND in which each cell can contain one bit of information. However, the use of an MLC NAND flash memory in which each cell can contains information various bits, which is superior to SLC flash memory in price and capacity, is increasing.

For example, in a SLC flash memory, a single cell can express the information "1" or "0", and in a two-level MLC flash memory, a single cell can express the information "00", "01", "11".

In addition, the MLC flash memory can express a variety of bit information on a cell in a bit split manner and in a page slit manner.

The MLC flash memory having the bit split manner can indicate the information on a variety of bits in the same page by using a single cell, and the MLC flash memory having the page split manner can indicate the information on the bits in several pages by using a single cell.

The flash memory can convert the cell status through an erase and program operation. If the cell status is not changed, an error is generated.

For reference, the term "program" used in the exemplary embodiments of the present invention, refers to the conversion of the bit information (from "0" to "1" or from "1" to "0") expressed in a cell in the MLC flash memory. Also, an error that occurs due to deletion or a program error can be discovered by reading the status register of a flash memory.

When the error mentioned above occurs, the MLC flash memory having a page split manner programs a specific page included in a cell, so that other page included in the identical cell can be influenced.

FIG. 1 is a block diagram illustrating configuration of a flash memory in the related art.

The flash memory can be divided into a user partition 110 and a reserved partition 120 which will substitute for a bad block 111 generated in the user partition 110. When a bad block 111c is generated in the specific block of the user partition 110, it is divided into a block-management module 130 which substitutes the corresponding bad block 111c with a free block of the reserved partition 120 and data buffer 140 which stores the data.

For example, in case of the MLC having a page split manner which allows two bits of information to be included in a cell, a page 4N+0 (111a) and a page 4N+2 (111c) are included in the same cell. Therefore, if a program error occurs while programming the page 4N+2 (111c), data of the 4N+0 (111a) can be damaged.

The block wherein an error has occurred due to the program error is changed into a bad run-time block.

For reference, the page 4N+0 (111a) is called an LSB page in a cell, and the page 4N+2 (111c) is called an MSB page in a cell.

In addition, in case of the MLC flash memory, a number of partial programs (NOP) is limited to one, and an order of page program in a block should be performed from the smaller number to the greater one.

The bad block may be generated by a program error or deletion error.

If the bad block 111 caused by a program error occurs in the user partition 110 illustrated in FIG. 1, a block-management module 130 selects a free block 121 which was not used in a reservation partition 120 and copies all data in the bad block 111 to the free block 121 in a page unit.

After the page 111c, in which a program error of the bad block 111 has occurred, is copied, the corresponding data stored in data buffer 140 is additionally copied to the free block 121. That is, a situation where the same page is copied twice in the free block 121 can occur.

The MLC flash memory having a page split manner can indicate several pages with a single cell. Therefore, other page included in the cell may be influenced if the specific page included in the cell is programmed. In addition, since the NOP of the MLC flash memory is limited to "1", the data trust cannot be secured.

SUMMARY OF THE INVENTION

Exemplary embodiments of the present invention overcome the above disadvantages and other disadvantages not described above. Also, the present invention is not required to overcome the disadvantages described above, and an exemplary embodiment of the present invention may not overcome any of the problems described above.

The present invention provides a method and apparatus for managing a bad run-time block in an MLC flash memory, wherein data damage of a page in which an error has not occurred is prevented by minimizing the interference between the pages included in the identical cell while processing a bad block, and data trust is secured by considering the NOP.

According to an aspect of the present invention, there is provided an apparatus for processing a bad run-time block in an MLC flash memory, the apparatus including a buffer-allotting module which allots a buffer in which data programmed in a least significant bit (LSB) of a cell is temporarily stored, a data-copying module which copies the data programmed in the LSB of the cell to the allotted buffer, and a bad-block-managing module which programs the copied data to a free block when a program error occurs in a page of the cell.

According to another aspect of the present invention, there is provided a method of processing a bad run-time block in an MLC flash memory, the method including allotting a buffer in which data in a least significant bit (LSB) of a cell is temporarily stored, copying the data programmed in the LSB of the cell to the allotted buffer, and programming the copied data to a free block when a program error occurs in a page of the cell.

BRIEF DESCRIPTION OF THE DRAWINGS

The above and other aspects of the present invention will become more apparent by describing in detail exemplary embodiments thereof with reference to the attached drawings, in which.

DETAILED DESCRIPTION OF EXEMPLARY EMBODIMENTS OF THE INVENTION

Figure 1:
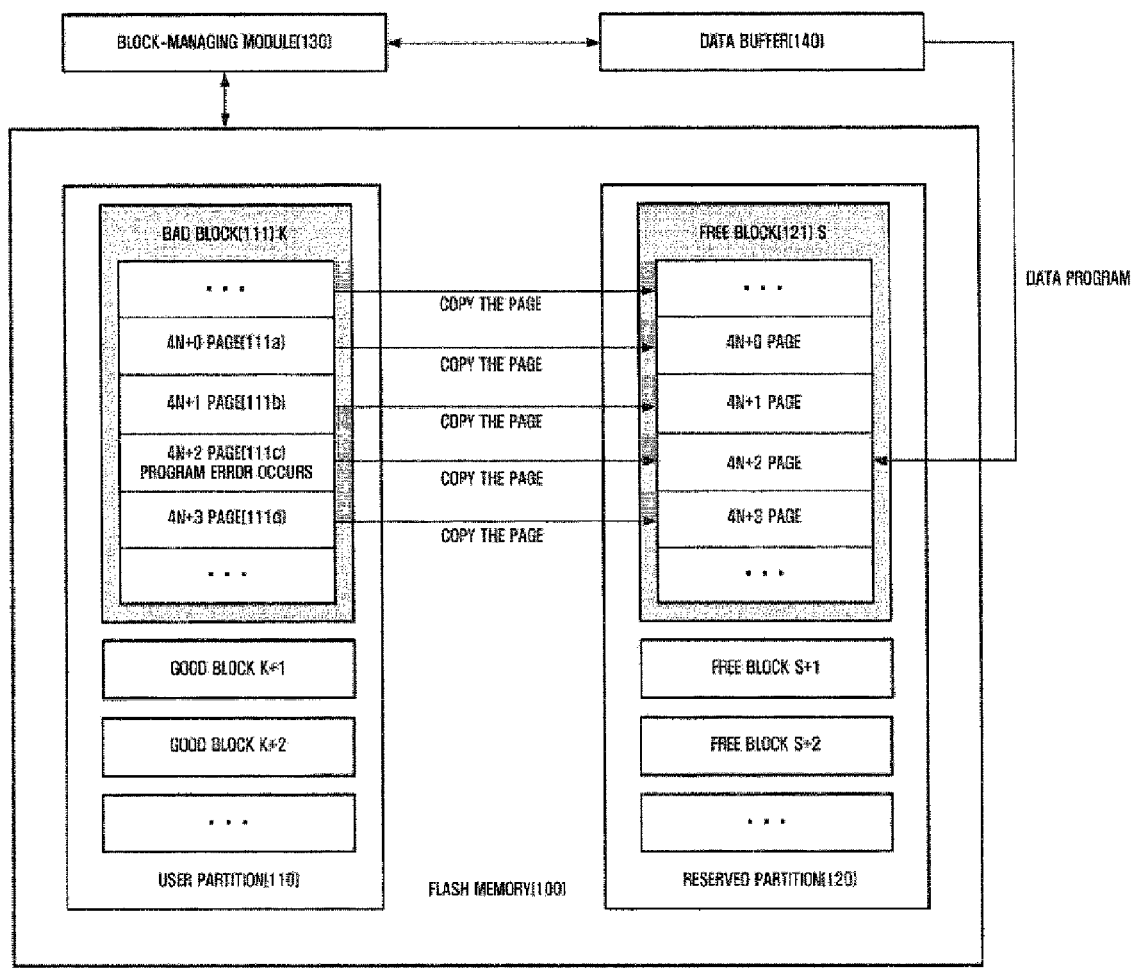
FIG. 1 is a block diagram illustrating configuration of a flash memory in the related art.

The present invention will now be described more fully with reference to the accompanying drawings, in which exemplary embodiments of the invention are shown.

Advantages and features of the aspects of the present invention and methods of accomplishing the same may be understood more readily by reference to the following detailed description of exemplary embodiments and the accompanying drawings. The aspects of the present invention may, however, be embodied in many different forms and should not be construed as being limited to the exemplary embodiments set forth herein. Rather, these exemplary embodiments are provided so that this disclosure will be thorough and complete and will fully convey the concept of the invention to those skilled in the art, and the present invention is defined by the appended claims. Like reference numerals refer to like elements throughout the specification.

Further, each block of the flowchart illustrations and combinations of blocks in the flowchart illustrations can be implemented by computer program instructions.

These computer program instructions can be provided to a processor of a general-purpose computer, special purpose computer, or other programmable data processing apparatus to produce a machine, such that the instructions, which are executed via the processor of the computer or other programmable data processing apparatus, create means for implementing the functions specified in the flowchart block or blocks.

These computer program instructions may also be stored in a computer-usable or computer-readable memory that can direct a computer or other programmable data processing apparatus to function in a particular manner, such that the instructions stored in the computer usable or computer-readable memory produce an article of manufacture including instruction means that implement the function specified in the flowchart block or blocks.

The computer program instructions may also be loaded into a computer or other programmable data processing apparatus to cause a series of operations to be performed in the computer or other programmable apparatus to produce a computer implemented process such that the instructions that are executed in the computer or other programmable apparatus provide operations for implementing the functions specified in the flowchart block or block.

Additionally, each block of the flowchart illustrations may represent a module, segment, or portion of code, which comprises one or more executable instructions for implementing the specified logical function(s).

It should also be noted that in some alternative implementations, the functions noted in the block may occur out of order.

For example, two blocks shown in succession may be executed substantially concurrently or the block may sometimes be executed in reverse order, depending upon the functionality involved.

Figure 2:
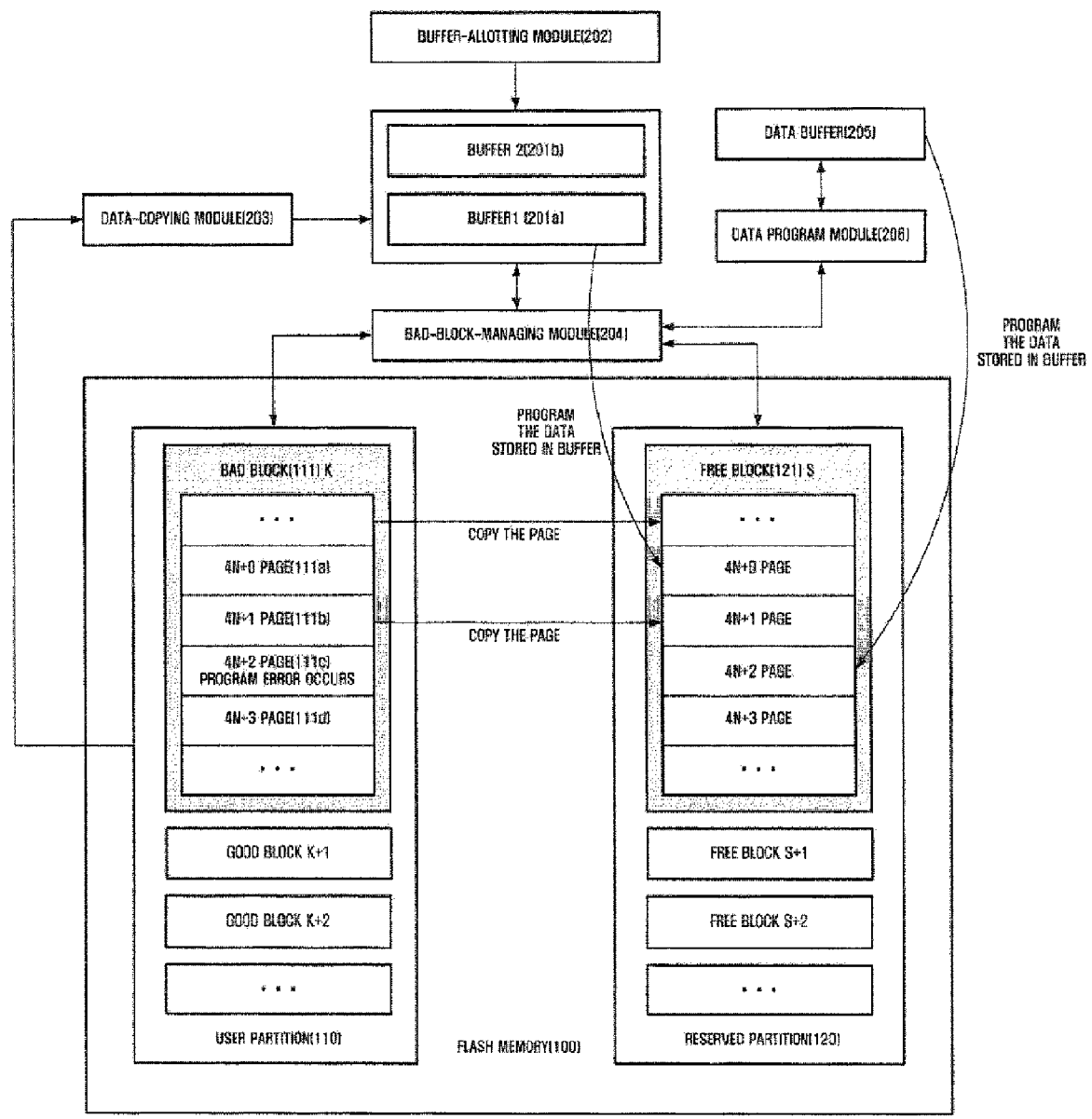
FIG. 2 is a block diagram illustrating configuration of an apparatus for processing a bad run-time block in an MLC flash memory according to an exemplary embodiment of the present invention.

FIG. 2 is a block diagram illustrating configuration of an apparatus for processing a bad run-time block in an MLC flash memory according to an exemplary embodiment of the present invention.

An apparatus 200 for processing a bad run-time block in an MLC flash memory includes buffers 201a and 201b in which data programmed in the page corresponding to an LSB of a cell is temporarily stored 201a and 201b, a buffer-allotting module 202 which allots the buffers 201a and 201b, a data-copying module 203 which copies the data programmed in the LSB of the cell to the allotted buffer, and a bad-block-managing module 204 which programs the copied data in a free block corresponding to a bad block when a program error occurs in the page of a cell, data buffer 205 which stores data to be programmed in the page of the cell, and data program module 206 which programs the data stored in the data buffer 205 to the page.

The term "module", as used herein, means, but is not limited to, a software or hardware component, such as a Field Programmable Gate Array (FPGA) or an Application Specific Integrated Circuit (ASIC), which performs certain tasks. A module may be configured to reside on the addressable storage medium and to execute on one or more processors. Thus, a "unit" may include, by way of example, components, such as software components, object-oriented software components, class components and task components, process, functions, attributes, procedures, subroutines, segments of program code, drivers, firmware, microcode, circuitry, data, databases, data structures, tables, arrays, and variables. The functionality provided for in the components and modules may be combined into fewer components and modules or further separated into additional components and modules.

The buffer-allotting module 202 allots the buffers 201a and 201b in which the data programmed in a page corresponding to LSB of a cell is temporarily stored.

At this time, the buffer-allotting module 202 maintains the corresponding buffers 201a and 201b until data set programmed in a page is completed.

Here, the data set refers to the beginning and the end of data. For example, if a single data is programmed through three pages, the three pages are changed into the data set.

Generally, performance of the program in the MLC flash memory is processed from the LSB to MSB in a cell. If an error occurs while programming data to the MSB after data is programmed to the LSB of a cell, even the data of the LSB existing in the same cell can be damaged. Therefore, the buffer-allotting module 202 temporarily stores the data to be programmed in the page corresponding to the LSB of a cell in the buffers 201a and 201b.

However, if an error occurs while programming data to the MSB after programming data to the LSB of a cell, even LSB data existing in the same cell can be damaged. Therefore, the data to be programmed in the page corresponding to the LSB of a cell is temporarily stored in the buffers 201a and 201b.

Figure 3:
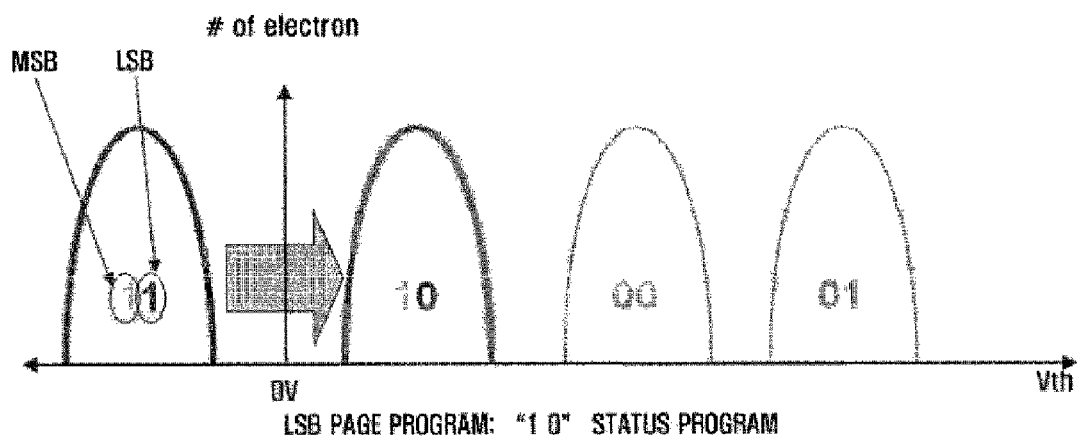
FIG. 3 illustrates the transition of a cell status when a program is changed to the status of 1.0 from an MLC flash memory having a two-level page split manner.
Figure 3:
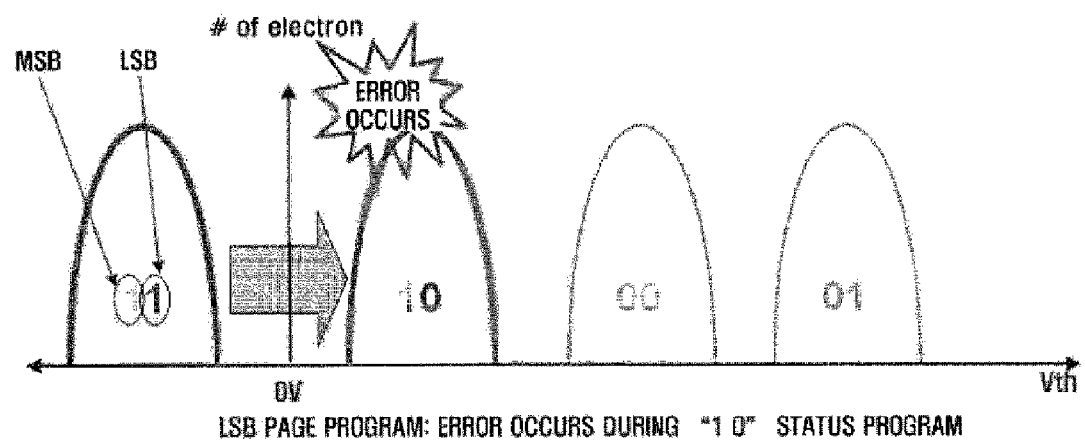
Figure 4:
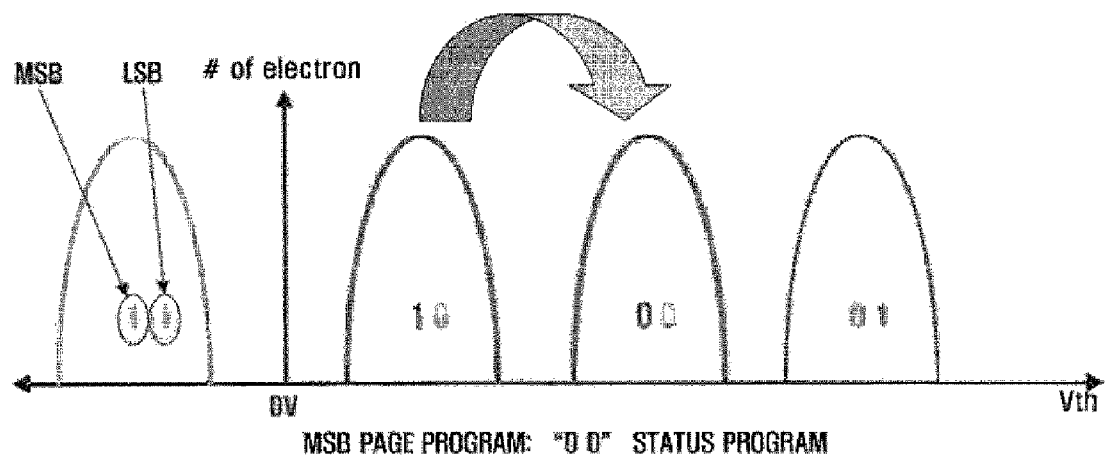
FIG. 4 illustrates the transition of a cell status when a program is changed to the status of 0.0 from an MLC flash memory having a two-level page split manner.
Figure 4:
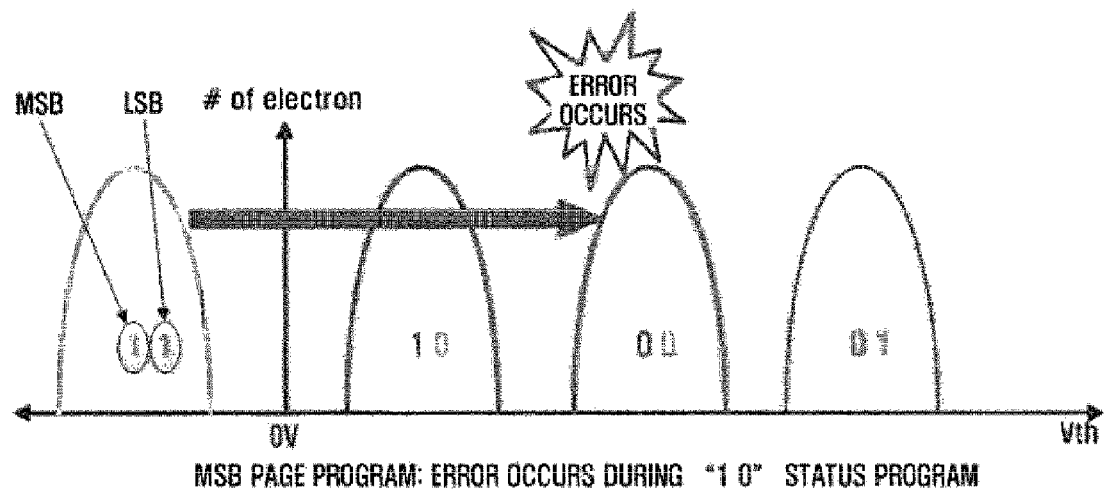
Figure 5:
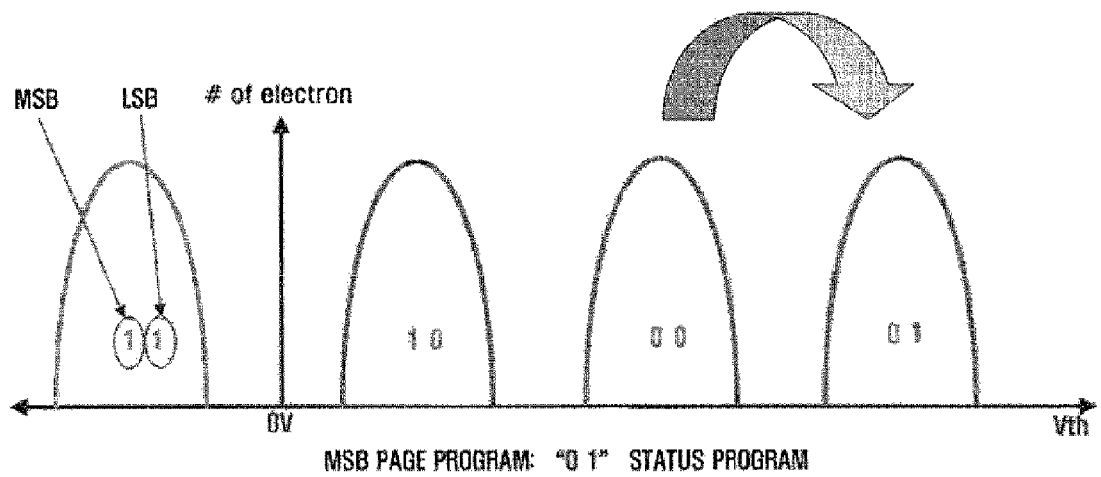
FIG. 5 illustrates the transition of a cell status when a program is changed to the status of 0.1 from an MLC flash memory having a two-level page split manner.
Figure 5:
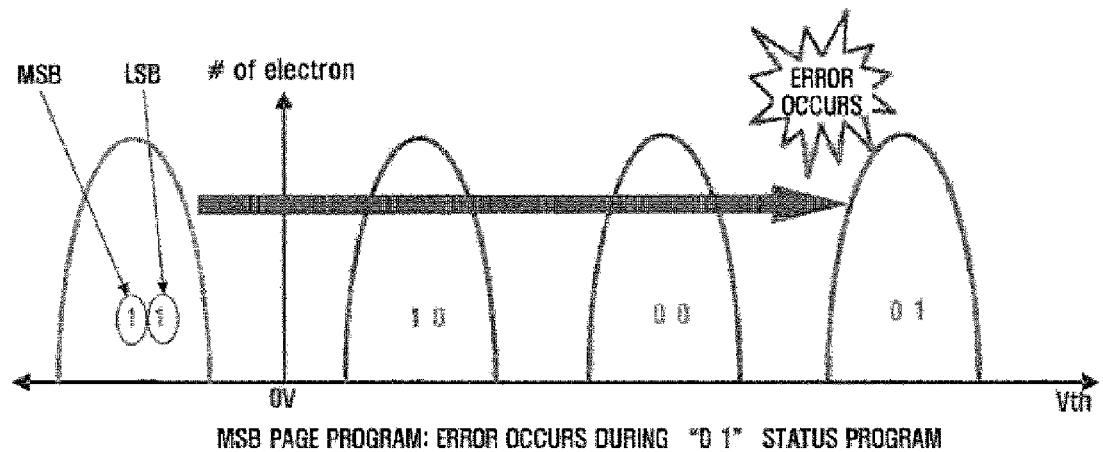

Interference occurring between the pages included in the same cell when a page error occurs in an MLC flash memory having two-level page split manner will follow from FIG. 3 to FIG. 5.

Here, it is assumed that the initial bits of the LSB and MSB are 1, and that they are included in the same cell.

FIG. 3 illustrates the transition of a cell status when a program is changed into the status of 1.0 from an MLC flash memory having two-level page split manner.

Only the LSB is programmed in order to convert MSB:LSB=(1,1) into MSB:LSB=(1,0) and, even though an error occurs while the LSB is programmed, it is acceptable because other blocks can be programmed again from the beginning. As a result, the data of LSB does not occur.

FIG. 4 illustrates the transition of a cell status when a program is changed to the status of 0.0 from an MLC flash memory having a two-level page split manner.

In the course of being programmed from MSB:LSB=(1,1) to MSB:LSB=(0,0), the cell status is changed into the middle status MSB:LSB=(1,0).

If the cell status is not changed into the final status MSB:LSB=(0,0) from MSB:LSB=(1,0), it ends in MSB:LSB=(1,0) and a program error occurs.

In this case, LSB program processing was successful. However, it can be regarded that an error has occurred in the course of programming the MSB. Due to the program error of the MSB, it can be generated that the initial status of LSB "1" is damaged into "0".

FIG. 5 illustrates the transition of a cell status when a program is changed to the status of 0.1 from an MLC flash memory having a two-level page split manner.

In the course of being programmed from MSB:LSB=(1,1) to MSB:LSB=(0,1), the cell status is changed into the middle status MSB:LSB=(1,0) and MSB:LSB=(0,0).

If the cell status is not changed into the final status MSB:LSB=(0,1) from MSB:LSB=(1,0) and MSB:LSB=(0,0), it ends in MSB:LSB=(1,0) or MSB:LSB=(0,0), and a program error occurs.

If an error occurs while programming the final status MSB:LSB=(0,1) and ends in the status MSB:LSB=(1,0) or MSB:LSB=(0,0), the initial status of the LSB "1" may be damaged into "0" due to the program error, and the initial status of the MSB "1" may be damaged into "0" as well.

As mentioned above, for the case where the LSB is damaged, the buffer-allotting module 202 allots the buffers 201a and 201b where the data programmed in a page corresponding to the LSB of a cell is temporarily stored.

The data-copying module 203 copies the data to the buffers 201a and 201b allotted through the buffer-allotting module 202 if the programmed page corresponds to the LSB of the cell.

The bad-block-managing module 204 is allotted with the free block corresponding to the bad block when an error occurs by checking if a program error has occurred on the page, and then initializes an index in order to copy a page to the allotted free block.

The bad-block-managing module 204 programs the data copied in the buffers 201a and 201b through the data-copying module 203 to the free block corresponding to the bad block when a program error occurs in a page of the cell.

The bad-block-managing module 204 checks if the page included in the bad block is LSB or MSB. If the data of the MSB illustrated in FIG. 5 is damaged, that is, if the page on which an error occurred corresponds to the MSB, the data of the page on which a program error occurred is programmed in the free block with reference to the data buffer 205.

The NOP of the MLC is one, which differs from the NOP of the SLC. Therefore, the data of a page on which an error occurred is copied in a free block not by directly copying the data of a page on which an error occurred as in the related art, but by considering the data buffer 205 in which the corresponding data is stored.

Figure 6:
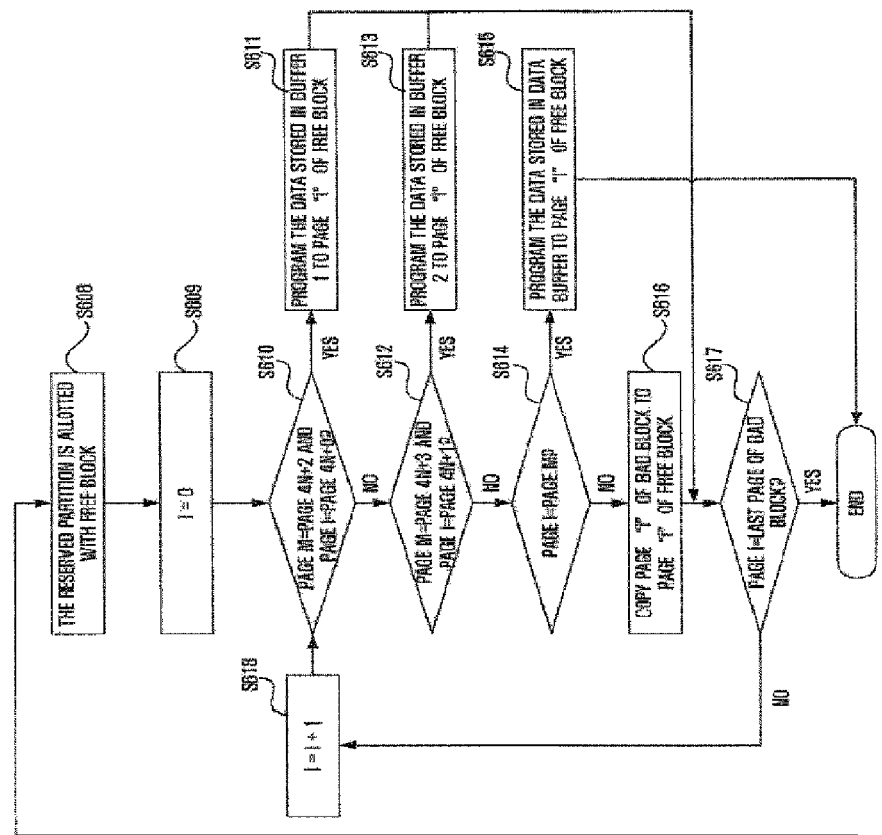
FIG. 6 is a flowchart illustrating a method of managing a bad run-time block in an MLC flash memory according to an exemplary embodiment of the present invention.
Figure 6:
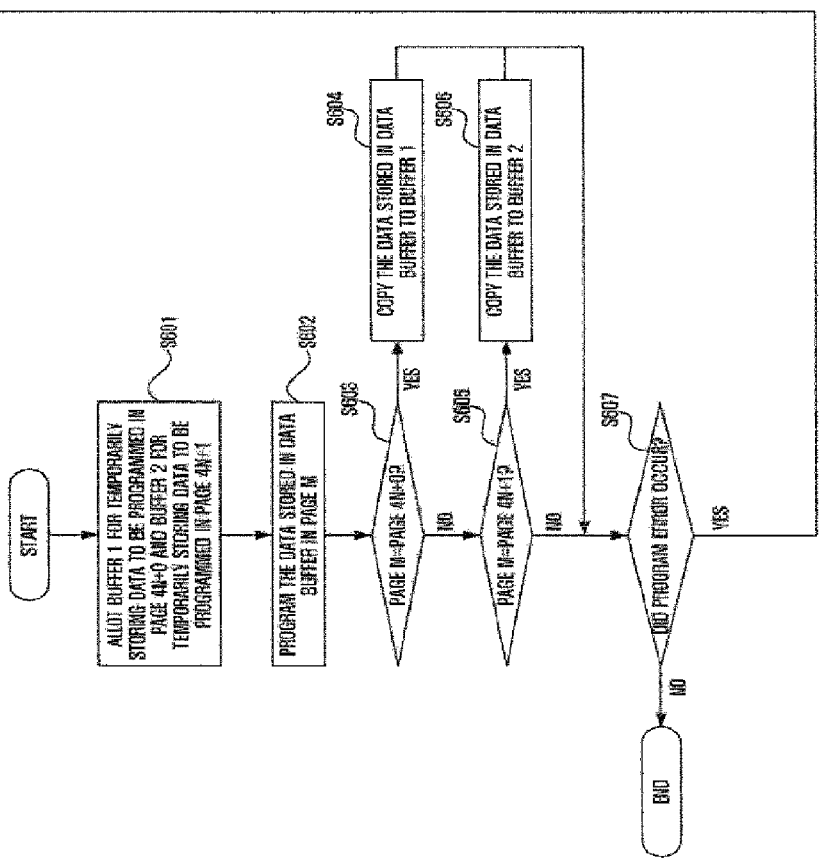

FIG. 6 is a flowchart illustrating a method of managing a bad run-time block in an MLC flash memory according to an exemplary embodiment of the present invention, the apparatus illustrated in FIG. 2 will be used for the convenience of description.

For reference, it will be assumed that all of the data of the MSB and LSB is damaged, the illustrated flash memory is divided into a user partition 210 and a reserved partition 220 which will substitute for the bad block 211 that has occurred in the user partition 210, the pages 4N+0 (211a), 4N+2 (211c), and 4N+1 (211b) are included in the identical cell.

In addition, when it is assumed that the pages 4N+0 (211a) and 4N+1 (211b) are LSB, 4N+2 (211c) and 4N+3 (211d) are MSB, an error occurs in the page 4N+2 (211c), and N is M/4 in FIG. 6, the N and M are integers of optional quantity.

The buffer-allotting module 202 respectively allots the buffers 201a and 201b for the pages included in the LSB of a cell (S601).

After operation S601, the data program module 206 programs the data stored in the data buffer 205 to a page M (S602).

After operation S602, the data-copying module 203 determines whether page M is 4N+0, that is, whether it is the LSB of a cell (S603). If it is determined that page M is 4N+0, the corresponding data existing on the data buffer 205 is copied to the buffer (S604).

If it is determined that page M is not 4N+0, the data-copying module 203 checks whether page M is 4N+1, that is, whether it is the LSB of a cell (S605). If it is determined that page M is 4N+1, the corresponding data is existing on the data buffer 205 is copied to the buffer (S606).

After operations S604 and S606 or if it is determined that page M is not 4N+1, the bad-block-managing module 204 checks the program error for page M (S607).

After operation S607, if there is no program error, the bad block processing is completed. If there is a program error, a single free block 211 is allotted from the reserved partition 220 through the bad-block-managing module 204 (S608).

After operation S608, the bad-block-managing module 204 initializes an index (i) for copying the page into 0 (S609).

After operation S609, the bad-block-managing module 204 determines whether page M is 4N+2 and the page "i" is 4N+0 (S610). If it is determined page M is 4N+2 and the page "i" is 4N+0, the data stored in a buffer 1 201a is programmed to the page "i" of a free block 221 (S611).

If it is determined page M is not 4N+2 and the page "i" is not 4N+0, the bad-block-managing module 204 determines whether page M is 4N+3 and the page "i" is 4N+1 (S612). If it is determined that page M is 4N+3 and the page "i" is 4N+1, the data stored in a buffer 2 201b is programmed to the page "i" of a free block 221 (S613).

If it is determined that page M is not 4N+3 and the page "i" is not 4N+1, the bad-block-managing module 204 determines whether the page "i" is page M (S614). If it is determined correct that the page "i" is page M, the data stored in the data buffer 202 is programmed to the page "i" of a free block 221 (S615) and the bad block processing is completed.

If it is determined correct that the page "i" is not page M, the bad-block-managing module 204 copies the page "i" of the bad block 210 to the page "i" of the free block 220 (S616).

After operation S616, S611 or S613, the bad-block-managing module 204 determines whether page "i" is the last page of the block (S617). If it is determined that page "i" not the last page, "i" is increased by one (S618) and then operation S610 is performed again.

If it is determined that page "i" is the last page of the block in operation S617, the block processing is completed.

As described above, the method and apparatus for managing a bad run-time block in an MLC flash memory produces one or more of the following effects.

The exemplary embodiments of present invention allows a bad block to be normally processed through the method of preventing data damage of a page in which an error did not occur by minimizing the interference occurred between the pages included in the identical cell while processing a bad block, and securing data trust by considering the allowed NOP.

What is claimed is:

1. An apparatus for managing a bad run-time block in a multi-level cell (MLC) flash memory, the apparatus comprising:
   a processor having computing device-executable instructions which comprise:
   a buffer-allotting module which allots a buffer in which data programmed in a least significant bit (LSB) of a cell is temporarily stored;
   a data-copying module which copies the data programmed in the LSB of the cell to the buffer allotted by the buffer-allotting module; and
   a bad-block-managing module which programs the data copied by the data-copying module in a free block if a program error occurs in a page of the cell.

2. The apparatus of claim 1, further comprising a data buffer which stores data to be programmed in a page of the cell.

3. The apparatus of claim 1, wherein the bad-block-managing module is allotted with the free block if an error occurs by determining whether a program error has occurred on the page.

4. The apparatus of claim 1, wherein the bad-block-managing module initializes an index for copying the page.

5. The apparatus of claim 1, wherein the bad-block-managing module programs data by determining whether the page included in the bad block is an LSB or a most significant bit.

6. The apparatus of claim 2, wherein the bad-block-managing module copies data of the page in which the program error has occurred to the free block with reference to the data buffer.

7. The apparatus of claim 6, wherein the page in which the program error has occurred is a most significant bit of the cell.

8. The apparatus of claim 1, wherein the buffer-allotting module maintains the buffer until the data programmed by the bad-block-managing module is completed being programmed.

9. A method of managing a bad run-time block in a multi-level cell (MLC) flash memory, the method comprising:
   allotting a buffer in which data programmed in a least significant bit (LSB) of a cell is temporarily stored;
   copying the data programmed in the LSB of the cell to the buffer allotted; and
   programming the data copied to the buffer to a free block when a program error occurs in a page of the cell.

10. The method of claim 9, wherein a free block is allotted if an error occurs by determining whether a program error has occurred in a page during the programming.

11. The method of claim 9, wherein an index for copying a page is initialized during the programming.

12. The method of claim 9, wherein data is programmed by determining whether the page included in the bad block is an LSB or a most significant bit (MSB) during the programming.

13. The method of claim 9, wherein data of the page in which the program error has occurred is copied to the free block with reference to data buffer during the programming.

14. The method of claim 13, wherein the page in which the program error has occurred is a most significant bit of the cell during the programming.

15. The method of claim 9, wherein the buffer is maintained until the programming of the data is completed.

16. A computer readable recording medium having recorded thereon a program for executing a method of managing a bad run-time block in a multi-level cell (MLC) flash memory, the method comprising:
   allotting a buffer in which data programmed in a least significant bit (LSB) of a cell is temporarily stored;
   copying data programmed in the cell to the buffer allotted if it is determined that the data is programmed in the LSB of the cell; and
   programming the data copied to the buffer to a free block if a program error occurs in a page of the cell.

* * * * *